United States Patent
Ogi et al.

(10) Patent No.: US 10,418,289 B2
(45) Date of Patent: Sep. 17, 2019

(54) ANOMALY DETECTION METHOD AND SEMICONDUCTOR MANUFACTURING APPARATUS

(71) Applicant: Tokyo Electron Limited, Tokyo (JP)

(72) Inventors: Tatsuya Ogi, Yamanashi (JP); Hiroaki Mochizuki, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 4 days.

(21) Appl. No.: 15/693,711

(22) Filed: Sep. 1, 2017

(65) Prior Publication Data
US 2018/0068906 A1    Mar. 8, 2018

(30) Foreign Application Priority Data
Sep. 6, 2016   (JP) .................................. 2016-173899

(51) Int. Cl.
| | |
|---|---|
| H01L 21/66 | (2006.01) |
| G01L 13/00 | (2006.01) |
| H01L 21/67 | (2006.01) |
| G05B 19/05 | (2006.01) |
| G05B 19/042 | (2006.01) |
| G05B 23/02 | (2006.01) |

(52) U.S. Cl.
CPC .............. *H01L 22/10* (2013.01); *G01L 13/00* (2013.01); *G05B 19/0428* (2013.01); *G05B 19/058* (2013.01); *H01L 21/67063* (2013.01); *G05B 23/0235* (2013.01)

(58) Field of Classification Search
CPC ....................................................... H01L 22/10
See application file for complete search history.

(56) References Cited

U.S. PATENT DOCUMENTS

2005/0146709 A1\*   7/2005   Oh ..................... H01J 37/32935
                                                                     356/72

FOREIGN PATENT DOCUMENTS

| JP | 2008-515198 | 5/2008 |
| WO | 2006/036821 | 4/2006 |

\* cited by examiner

*Primary Examiner* — William A Harriston
(74) *Attorney, Agent, or Firm* — IPUSA, PLLC (57) ABSTRACT

A method performed by a semiconductor manufacturing apparatus includes calculating, by a processor of the semiconductor manufacturing apparatus, 3 standard deviations of process condition measurements obtained at a predetermined interval from log information of processing of substrates that have been correctly processed, calculating at least one of an upper limit and a lower limit for anomaly detection based on the calculated 3 standard deviations, and detecting an anomaly in the processing of the substrates based on the at least one of the upper limit and the lower limit.

9 Claims, 9 Drawing Sheets

| PROCESS CONDITION | RECIPE P | | | | |
|---|---|---|---|---|---|
| PRESSURE | STEP 1 | STEP 2 | STEP 3 | STEP 4 | STEP 5 |
| WAFER 1 | $X_{11} X_{12}$ ⊢1 ms⊣ | $X_{16}$ ⊢1 ms⊣ | $X_{1p}$ ⊢1 ms⊣ | | $X_{1q}$ ⊢1 ms⊣ $X_{1r}$ ⊢1 ms⊣ |
| WAFER 2 | $X_{21} X_{22}$ | $X_{26}$ | $X_{2p}$ | | $X_{2q}$ $X_{2r}$ |
| ... | ... | ... | ... | | ... ... |
| WAFER n | $X_{n1} X_{n2}$ | $X_{n6}$ | $X_{np}$ | | $X_{nq}$ $X_{nr}$ |

FIG.4

SET OF MEASUREMENTS: $X_1, X_2, X_3, X_4, X_5, \ldots X_n$ ("n" MEASUREMENTS)
MEAN VALUE: m
STANDARD DEVIATION: $\sigma$ $$\sigma = \sqrt{\frac{(X_1-m)^2+(X_2-m)^2+\ldots+(X_n-m)^2}{n-1}} \quad \cdots(1)$$

MEAN VALUE −3$\sigma$

MEAN VALUE m

MEAN VALUE +3$\sigma$

ANOMALY DETECTION METHOD AND SEMICONDUCTOR MANUFACTURING APPARATUS

CROSS-REFERENCE TO RELATED APPLICATION

The present application is based upon and claims the benefit of priority of Japanese Patent Application No. 2016-173899, filed on Sep. 6, 2016, the entire contents of which are incorporated herein by reference.

BACKGROUND OF THE INVENTION

1. Field of the Invention

An aspect of this disclosure relates to an anomaly detection method and a semiconductor manufacturing apparatus.

2. Description of the Related Art

In manufacturing a semiconductor, a wafer is processed while continuously monitoring signals indicating process conditions such as a pressure and a gas flow rate for each process recipe (which is hereafter simply referred to as a "recipe"). For each process condition, a normal range (which is defined by an upper limit and a lower limit) is predetermined. When a monitored signal is greater than the upper limit or less than the lower limit of the predetermined normal range, it is determined that an anomaly has occurred.

For example, Japanese Laid-Open Patent Publication No. 2008-515198 discloses a monitoring method used for anomaly detection during a semiconductor manufacturing process. Japanese Laid-Open Patent Publication No. 2008-515198 discloses that when a measured self-bias voltage is out of a predetermined bias voltage range, the measured self-bias voltage is correlated with, for example, an improper etching rate.

However, with the technologies disclosed in Japanese Laid-Open Patent Publication No. 2008-515198, small anomalies during wafer processing may not be detected depending on the setting of a specific value range indicating a normal range of the self-bias voltage. For example, when a wide normal range is set or a dead time, which is a predetermined time period where no anomaly detection is performed, is set between steps in a recipe, small anomalies during wafer processing may not be detected.

SUMMARY OF THE INVENTION

In an aspect of this disclosure, there is provided a method performed by a semiconductor manufacturing apparatus. The method includes calculating, by a processor of the semiconductor manufacturing apparatus, 3 standard deviations of process condition measurements obtained at a predetermined interval from log information of processing of substrates that have been correctly processed, calculating at least one of an upper limit and a lower limit for anomaly detection based on the calculated 3 standard deviations, and detecting an anomaly in the processing of the substrates based on the at least one of the upper limit and the lower limit.

DESCRIPTION OF THE PREFERRED EMBODIMENTS

Embodiments of the present invention are described below with reference to the accompanying drawings. Throughout the specification and the drawings, the same reference number is assigned to substantially the same components, and repeated descriptions of those components are omitted.

<Configuration of Semiconductor Manufacturing System>

Figure 1:
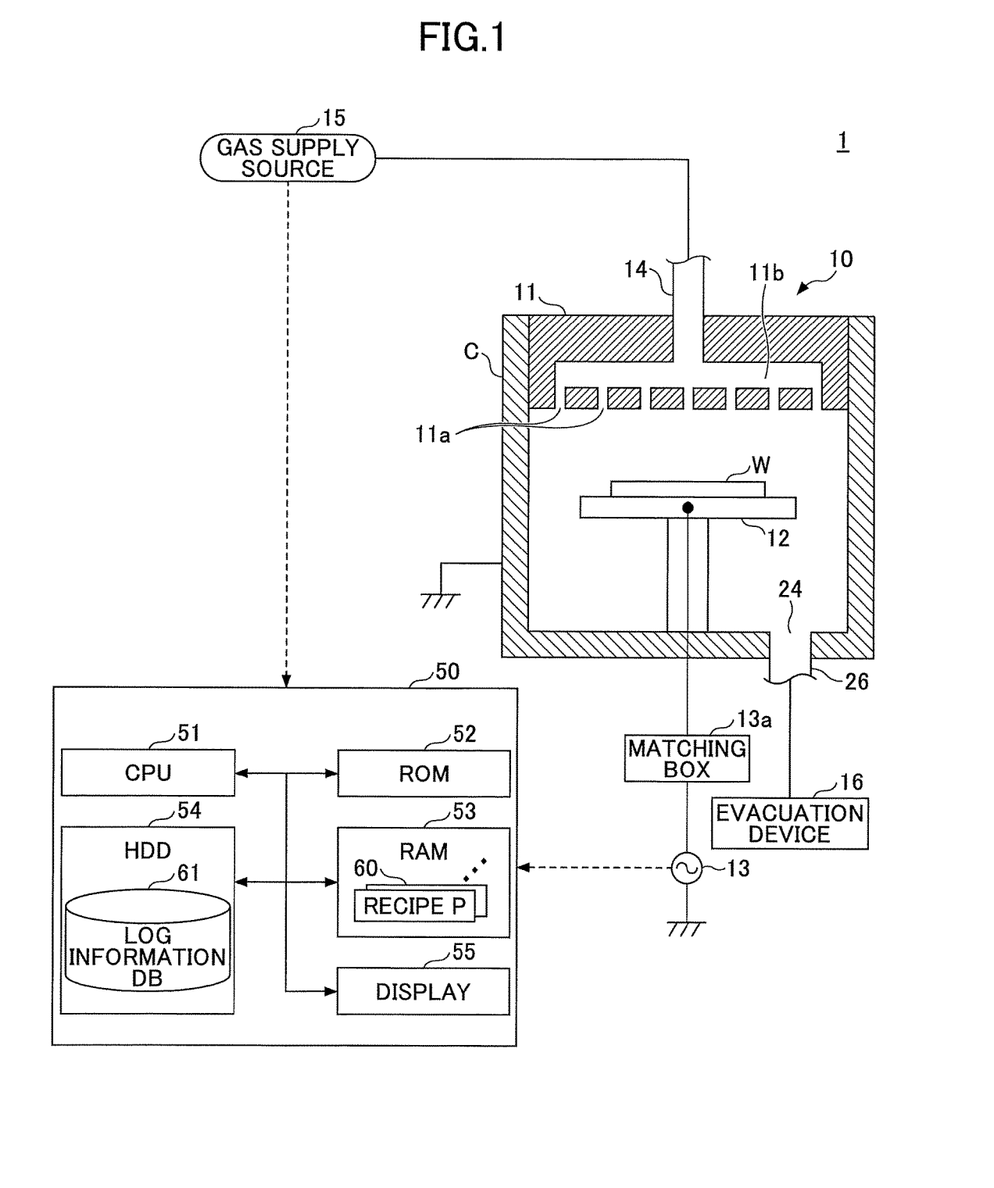
FIG. 1 is a drawing illustrating a semiconductor manufacturing system according to an embodiment.

An exemplary configuration of a semiconductor manufacturing system 1 according to an embodiment is described with reference to FIG. 1. The semiconductor manufacturing system 1 includes a semiconductor manufacturing apparatus 10 and a controller 50. In the present embodiment, a capacitively-coupled plasma etching apparatus is used as an example of the semiconductor manufacturing apparatus 10.

The semiconductor manufacturing apparatus 10 includes a cylindrical chamber C (process chamber) made of, for example, aluminum whose surface is alumite-treated (or anodized). Predetermined processes such as etching are performed on a semiconductor wafer (which is hereafter referred to as a "wafer W") in the chamber C. The chamber C is grounded. A mount table 12 is provided in the chamber C. The wafer W is placed on the mount table 12.

A high-frequency power supply 13 for exciting plasma is connected via a matching box 13a to the mount table 12. The mount table 12 functions as a table on which the wafer W is placed as well as a lower electrode. The high-frequency power supply 13 applies, to the mount table 12, high-frequency power with a frequency of, for example, 40 MHz, which is suitable to generate plasma in the chamber C. While plasma is being generated in the chamber C, the matching box 13a functions so that the internal impedance of the high-frequency power supply 13 apparently matches the load impedance.

A gas shower head 11 is provided on the ceiling of the chamber C. The gas shower head 38 also functions as an upper electrode. With this configuration, the high-frequency power from the high-frequency power supply 13 is applied to a "capacitor" formed between the mount table 12 and the gas shower head 11. A gas supplied from a gas supply source 15 is introduced into the gas shower head 11 through a gas inlet 14, passes through a gas buffer space 11b, and is supplied via gas holes 11a into the chamber C.

The semiconductor manufacturing apparatus 10 performs fine processing on the wafer W using gases supplied into the chamber C. An evacuation pipe 26 forming an evacuation port 24 is provided at the bottom of the chamber C, and the evacuation pipe 26 is connected to an evacuation device 16. The evacuation device 16 is implemented by a vacuum pump such as a turbo molecular pump or a dry pump. The evacuation device 16 reduces the pressure of a process space in the chamber C to a predetermined vacuum pressure, and discharges gases in the chamber C via the evacuation port 24 and the evacuation pipe 26.

When the semiconductor manufacturing apparatus 10 with the above configuration performs a process such as etching on the wafer W, the wafer W is held on a conveying arm and carried into the chamber C via a gate valve. The wafer W is held above the mount table 12 by pusher pins, and is placed on the mount table 12 by lowering the pusher pins. The pressure in the chamber C is maintained at a preset value by the evacuation device 16. A gas supplied from the gas supply source 15 is introduced via the gas shower head 11 into the chamber C in the form of a shower. Also, high-frequency power supplied from the high-frequency power supply 13 is applied to the mount table 12.

The introduced gas is ionized or disassociated by the high-frequency power to generate plasma, and a process such as etching is performed on the wafer W by the plasma. After the plasma etching is completed, the wafer W is held on the conveying arm and carried out of the chamber C. The above process is repeated to process multiple wafers W in succession.

The controller 50 controls wafer processing performed by the semiconductor manufacturing apparatus 10. The controller 50 includes a central processing unit (CPU) 51, a read-only memory (ROM) 52, a random access memory (RAM) 53, a hard disk drive (HDD) 54, and a display 55. The CPU 51 controls processes such as etching according to procedures defined by recipes P60 stored in the RAM 53.

The controller 50 stores log information regarding processes performed on the wafer W in a log information database (DB) 61 in the HDD 54. The controller 50 detects anomalies that occur during wafer processing. The controller 50 may be configured to display the detected anomalies on the display 55 to alert an operator. Functions of the controller 50 may be implemented either by software or hardware.

<Anomaly Detection Method of Comparative Example>

Figure 2:
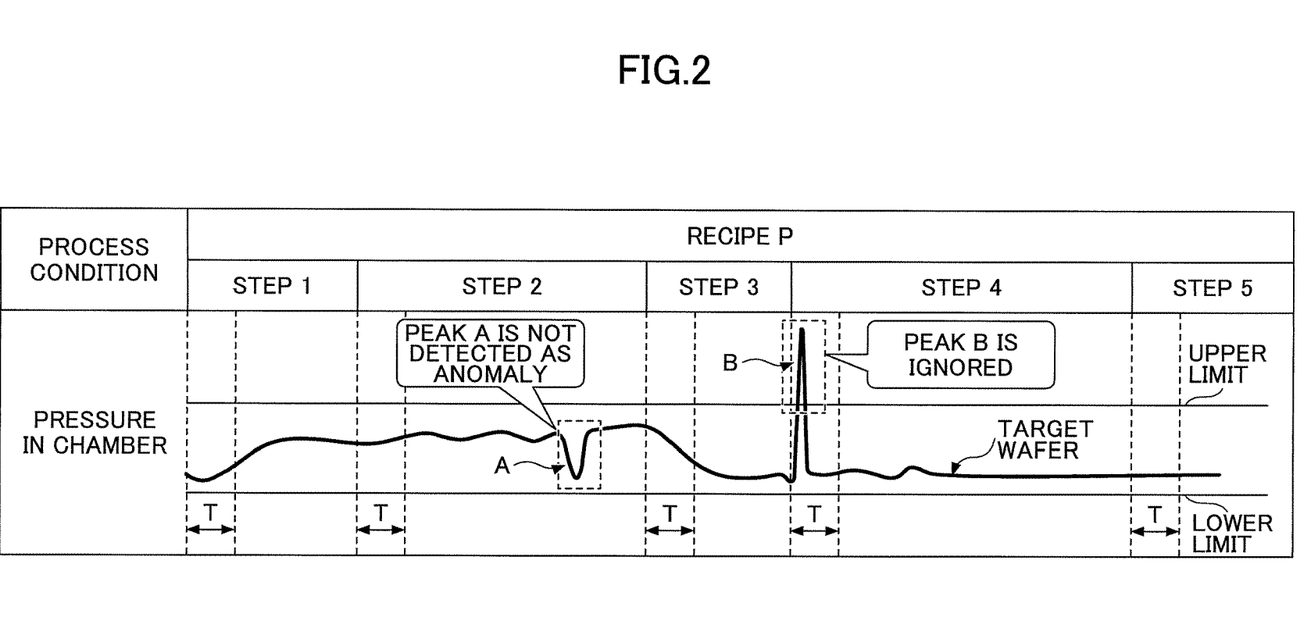
FIG. 2 is a drawing illustrating an anomaly detection method of a comparative example.

In the descriptions below, the pressure in the chamber C is used as an example of a process condition to be monitored while the wafer W is processed. Before describing an anomaly detection method of an embodiment of the present invention, an anomaly detection method of a comparative example is described with reference to FIG. 2. FIG. 2 is a drawing illustrating an anomaly detection method of a comparative example.

In this example, the wafer W is processed according to steps 1 through 5 defined by a recipe P. While processing the wafer W, the controller 50 monitors the pressure in the chamber C using a pressure gauge provided in the chamber C.

In the comparative example, an upper limit and a lower limit used for anomaly detection are set at fixed values, and the controller 50 determines that an anomaly has occurred when the monitored pressure becomes greater than the upper limit or less than the lower limit. The controller 50 obtains pressure measurements in the chamber C during wafer processing at an interval of, for example, 100 ms, and calculates the upper limit and the lower limit for anomaly detection based on the distribution of the pressure measurements.

Here, as exemplified by a peak B at the beginning of step 4 in FIG. 2, a peak pressure may occur immediately after the process proceeds to the next step and the process condition changes. In the comparative example, to prevent detection of an anomaly based on a peak pressure (e.g., peak B) monitored at the beginning of each step (e.g., step 4), a dead time T where pressure measurements are not monitored is set at the beginning of each step. Thus, in the comparative example, no anomaly can be detected during the dead time T.

Also in the comparative example, because the upper limit and the lower limit for anomaly detection are fixed values, the upper limit and the lower limit need to be set to define a wide normal range taking into account a margin. In this case, even when a pressure measurement (e.g., a peak A in step 2 of FIG. 2) actually indicates an anomaly, the pressure measurement is not detected as an anomaly as long as the peak is within the wide normal range defined by the upper limit and the lower limit.

<Anomaly Detection Method of Embodiment>

In an anomaly detection method according to an embodiment of the present invention, pressure measurements are obtained at a high resolution, and the upper limit and the lower limit are updated in real time to appropriate values, so that an anomaly can be reliably detected based on the obtained pressure measurements.

In the present embodiment, the dead time T is not set; and the controller 50 monitors the pressure in the chamber C at an interval of 1 ms (1-ms interval) during wafer processing to obtain pressure measurements, and calculates 3 standard deviations ($3\sigma$) indicating the distribution of the obtained pressure measurements. Then, the controller 50 calculates the upper limit and the lower limit for anomaly detection based on $3\sigma$ in real time, and detects an anomaly in wafer processing based on the calculated upper and lower limits.

Figure 3:
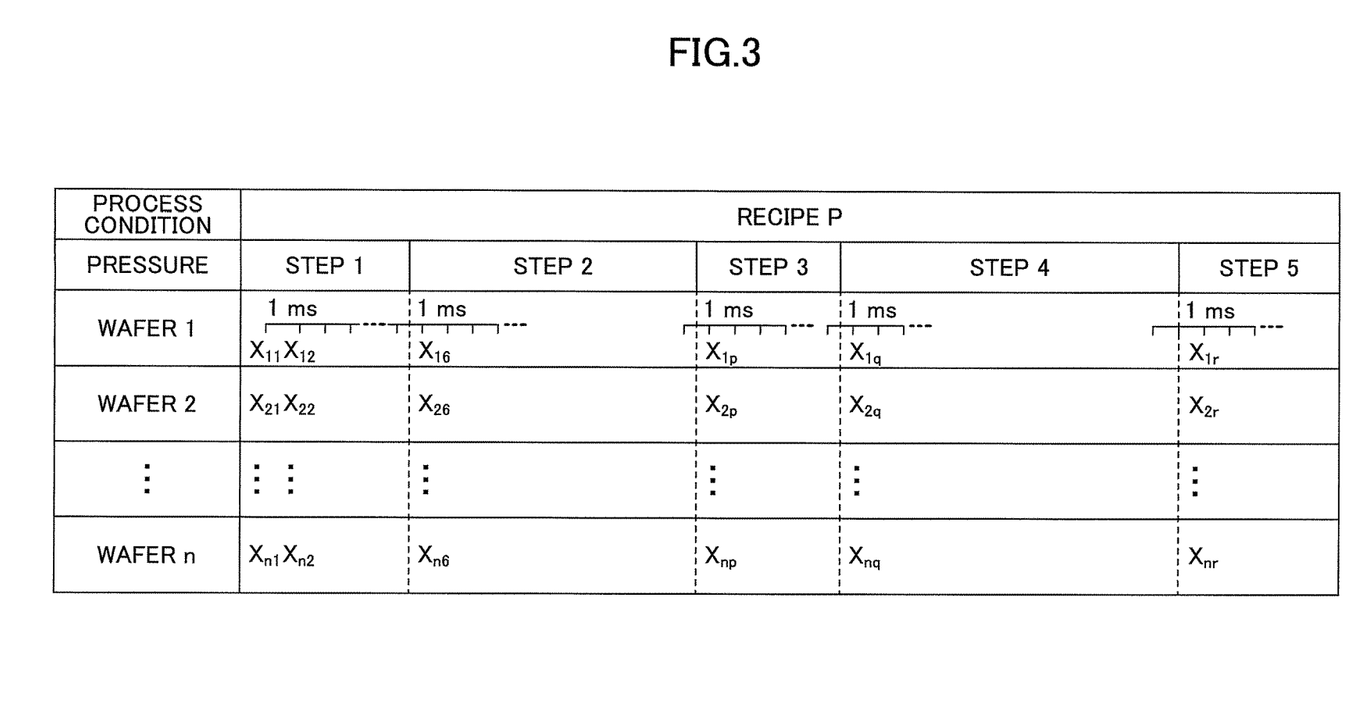
FIG. 3 is a drawing illustrating pressure measurements obtained for each wafer at a resolution of 1 ms.

FIG. 3 illustrates an exemplary case where the process condition to be monitored is the pressure in the chamber C, a recipe P to be executed includes steps 1 through 5, and pressure measurements X are obtained for each of wafers 1 through n while they are processed. In this exemplary case, the pressure measurements X are obtained at a resolution of 1 ms across the boundaries of the steps. Pressure measurements may be obtained from log information of each wafer at an interval of several ms or less, and preferably at a 1-ms interval. Pressure measurements are obtained at the same interval for all wafers. As long as the interval is the same, pressure measurements may be obtained either at the same timing or at different timings for respective wafers. However, pressure measurements are obtained only from log information of wafers that have been correctly processed. The number "n" of wafers is an integer greater than or equal to 2, and is preferably between 50 and 100 or greater.

Figure 4:
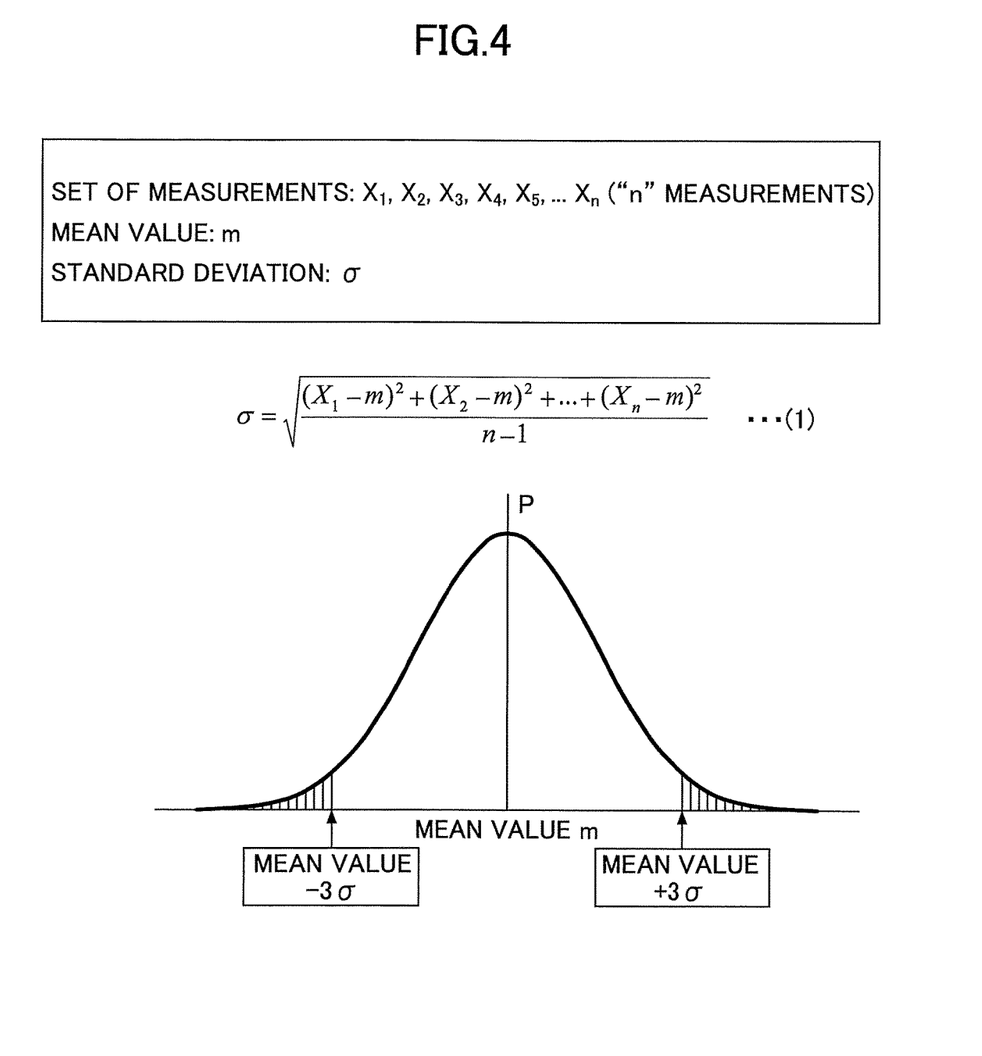
FIG. 4 is a graph illustrating a standard deviation ($\sigma$)

The controller 50 calculates 3 standard deviations ($3\sigma$) based on "n" pressure measurements. A standard deviation $\sigma$ is calculated according to formula (1) below.

$$\sigma = \sqrt{\frac{(X_1 - m)^2 + (X_2 - m)^2 + \ldots + (X_n - m)^2}{n - 1}} \quad (1)$$

As illustrated in FIG. 4, the controller 50 calculates 3 standard deviations ($3\sigma$) based on "n" pressure measurements, and calculates an upper limit and a lower limit for anomaly detection based on $3\sigma$. The upper limit for anomaly detection is calculated by "mean value $m+3\sigma$". The lower limit for anomaly detection is calculated by "mean value $m-3\sigma$". In the normal distribution of pressure measurements P illustrated by the graph of FIG. 4, a hatched range above the upper limit and a hatched range below the lower limit can be determined as anomalous data ranges.

In the present embodiment, 3σ is calculated based on each set of pressure measurements obtained at the same timing or substantially the same timing (e.g., within the same 1-ms interval) among the pressure measurements obtained at the 1-ms interval for the respective wafers W, and the upper limit and the lower limit for anomaly detection are calculated for each interval based on the calculated 3σ.

For example, pressure measurements $X_{11}$ through $X_{n1}$ obtained at the same timing or substantially the same timing in step 1 for "n" wafers W are selected from pressure measurements obtained at the 1-ms interval, and a standard deviation σ is calculated by substituting the pressure measurements $X_{11}$ through $X_{n1}$ in formula (1). Then, based on 3 standard deviations (3σ) and a mean value m of the pressure measurements $X_{11}$ through $X_{n1}$, the upper limit (=mean value m+3σ) and the lower limit (=mean value m−3σ) for anomaly detection are calculated.

Similarly, the upper limit (=mean value m+3σ) and the lower limit (=mean value m−3σ) for anomaly detection are calculated using formula (1) and pressure measurements $X_{12}$ through $X_{n2}$ obtained at the next timing (the same timing or substantially the same timing).

Thus, based on pressure measurements obtained at the 1-ms interval for respective wafers W, the upper limit and the lower limit for anomaly detection are calculated at the 1-ms interval.

Figure 5:
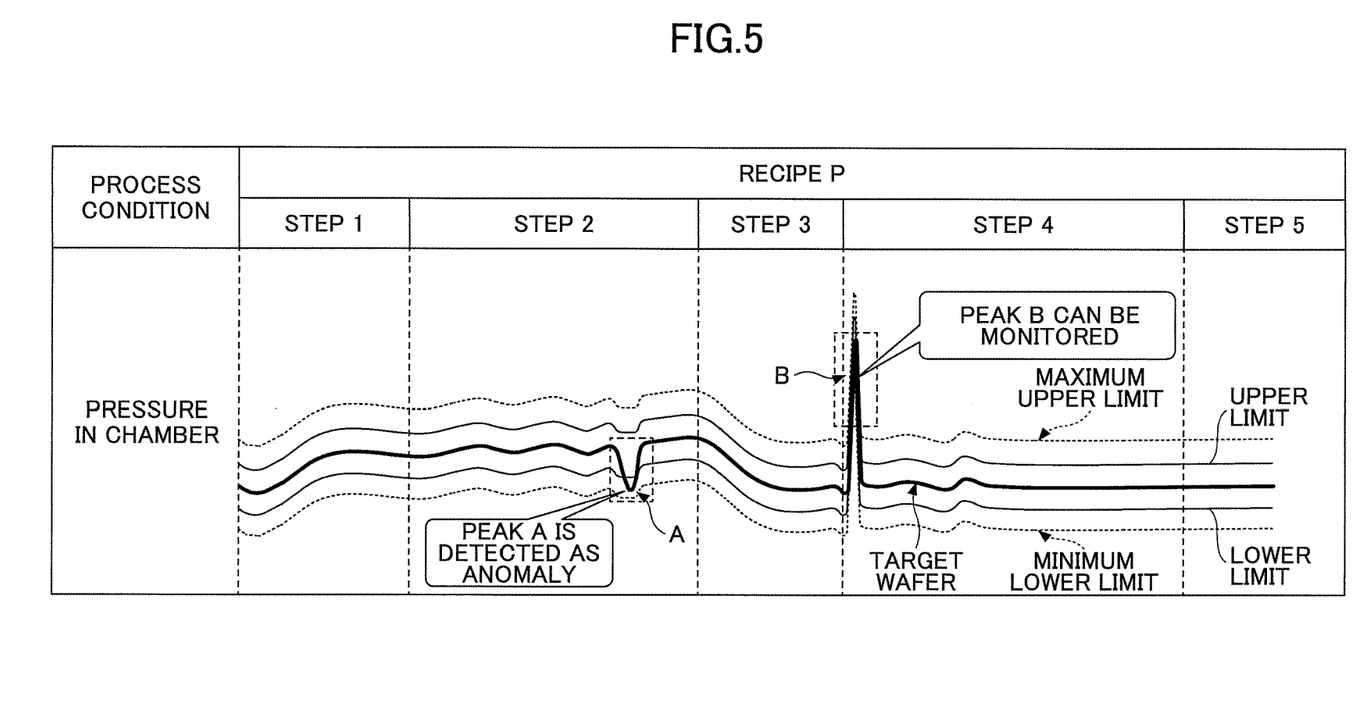
FIG. 5 is a drawing illustrating an anomaly detection method according to an embodiment.

With the above method, as exemplified by FIG. 5, the upper limit and the lower limit of pressure used for anomaly detection are set at appropriate values corresponding to process conditions set for the respective steps in the recipe P. Thus, the above method makes it possible to properly detect an anomaly in wafer processing by detecting a pressure measurement that is greater than the upper limit or less than the lower limit set for anomaly detection.

Although the controller 50 calculates both of the upper limit and the lower limit for anomaly detection in the present embodiment, the controller 50 may be configured to calculate one of the upper limit and the lower limit and detect an anomaly in wafer processing based on one of the upper limit and the lower limit.

<Calculation of Upper Limit and Lower Limit (Initial Values) for Anomaly Detection>

Figure 6:
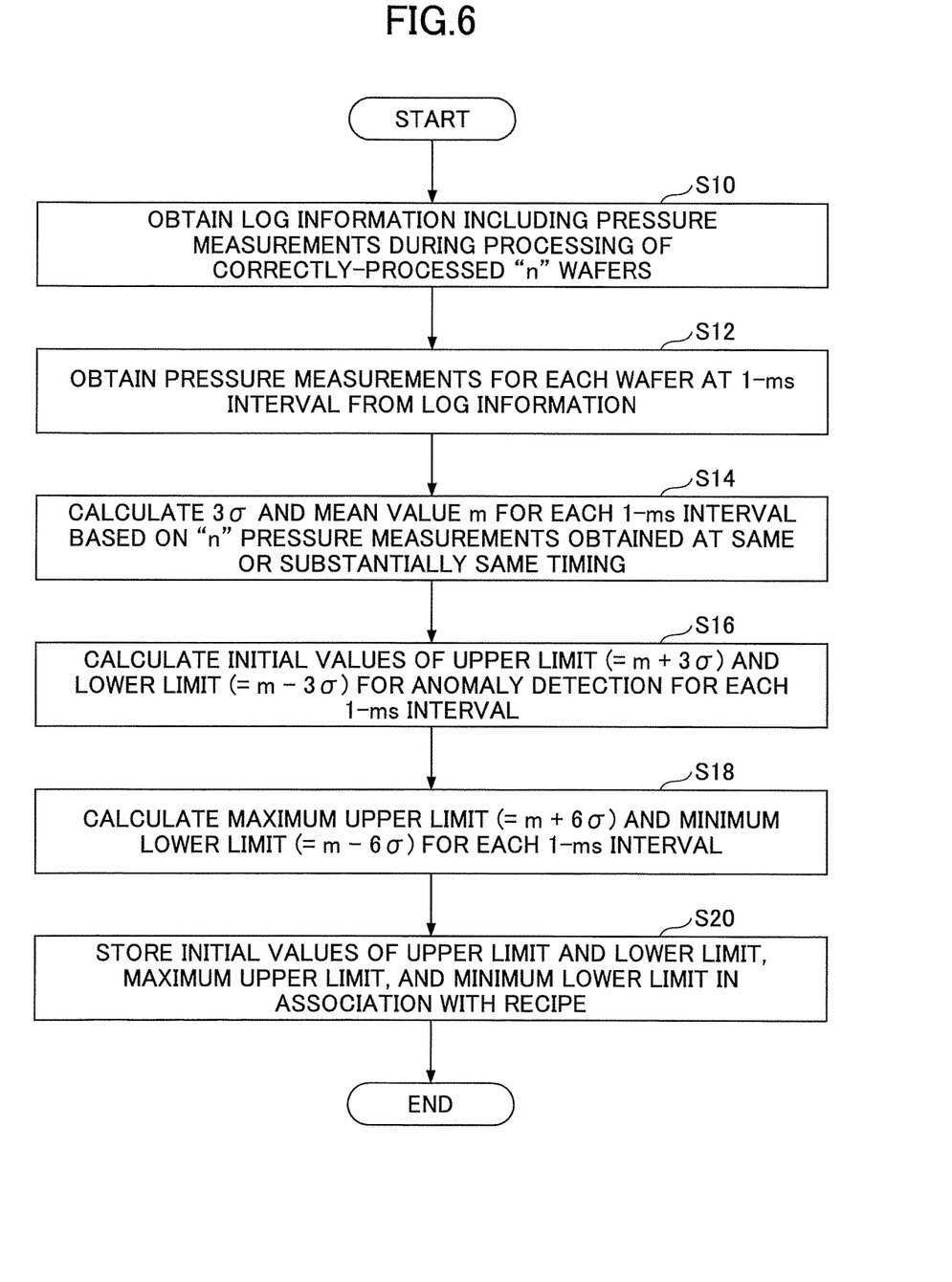
FIG. 6 is a flowchart illustrating an example of a calculation process for calculating an upper limit and a lower limit (initial values) for anomaly detection according to an embodiment.

An example of a calculation process for calculating an upper limit and a lower limit (initial values) used for an anomaly detection method of the present embodiment is described with reference to FIG. 6. FIG. 6 is a flowchart illustrating an example of a calculation process for calculating an upper limit and a lower limit (initial values) for anomaly detection according to the present embodiment.

The calculation process of FIG. 6 is preferably executed before starting the anomaly detection method of the present embodiment. The log information DB 61 stores log information for "n" or more wafers that have been correctly processed. For example, the log information DB 61 preferably stores log information for 50 to 100 wafers. The calculation process is executed mainly by the CPU 51 of the controller 50. The log information DB 61 stores log information for wafers that are determined as having been correctly processed by, for example, an inspection device for inspecting the surfaces of the wafers.

When the calculation process of FIG. 6 is started, the CPU 51 obtains, from the log information DB 61, log information including pressure measurements measured during the processing of "n" wafers that have been correctly processed (step S10). Next, the CPU 51 obtains pressure measurements for each wafer at an interval of 1 ms from the obtained log information (step S12).

Next, the CPU 51 calculates 3σ and a mean value m for each 1-ms interval based on "n" pressure measurements obtained at the same timing or substantially the same timing (step S14). Then, based on 3σ and the mean value m calculated at step S14, the CPU 51 calculates the initial values of the upper limit (=mean value m+3σ) and the lower limit (=mean value m−3σ) for anomaly detection for each 1-ms interval (step S16).

Next, the CPU 51 calculates a maximum upper limit (=mean value m+6σ (6 standard deviations)) and a minimum lower limit (=mean value m−6σ) for each 1-ms interval (step S18). The maximum upper limit indicates the maximum possible value of the upper limit, and the minimum lower limit indicates the minimum possible value of the lower limit. In the present embodiment, as described later, the upper limit and the lower limit for anomaly detection are automatically updated. Generally, the internal environment of the chamber C changes due to, for example, adhesion of reaction products, and the upper limit and the lower limit for anomaly detection change according to the change in the internal environment of the chamber C. When the upper limit becomes greater than the maximum upper limit and the lower limit becomes less than the minimum lower limit, it can be determined that the inside of the chamber C needs to be cleaned. For this purpose, when calculating the initial values of the upper limit and the lower limit for anomaly detection, the controller 50 also calculates the maximum upper limit and the minimum lower limit.

Then, the CPU 51 stores the initial values of the upper limit and the lower limit, the maximum upper limit, and the minimum lower limit calculated at the above steps in a storage such as the HDD 54 or the RAM 53 in association with the recipe P (step S20), and ends the calculation process.

Different process conditions are used for steps of different recipes P. Therefore, the controller calculates the upper limit, the lower limit, the maximum upper limit, and the minimum lower limit for each recipe P, and stores them in association with the corresponding recipe P. Thus, the initial values of the upper limit and the lower limit, the maximum upper limit, and the minimum lower limit that are appropriate for the corresponding recipe P are set as illustrated in FIG. 5.

The upper limit and the lower limit for anomaly detection may not necessarily be calculated based on 3σ, and may be calculated based on, for example, 2σ. Also, the maximum upper limit and the minimum lower limit may not necessarily be calculated based on 6σ, and may be calculated based on, for example, 4σ or 5σ.

When recalculating the upper limit and the lower limit for anomaly detection after cleaning the chamber C, the controller 50 preferably recalculates the maximum upper limit and the minimum lower limit for the recalculated upper and lower limits.

Although the controller 50 calculates both of the maximum upper limit and the minimum lower limit in the present embodiment, the controller 50 may be configured to calculate one of the maximum upper limit and the minimum lower limit and determine whether one of the upper limit and the lower limit is within the calculated maximum upper limit or minimum lower limit.

<Anomaly Detection Process>

Figure 7:
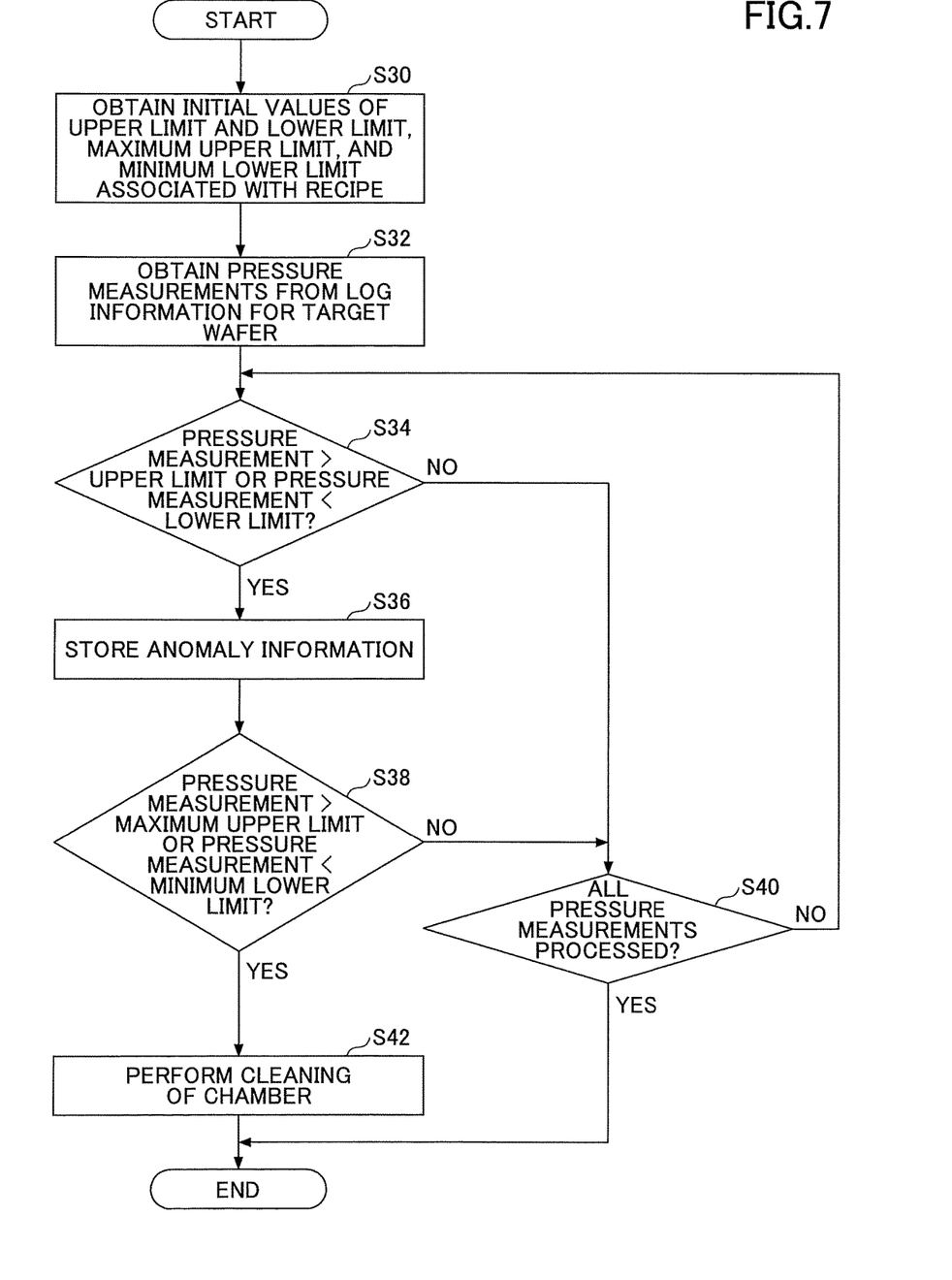
FIG. 7 is a flowchart illustrating an example of an anomaly detection process according to an embodiment.

Next, an example of an anomaly detection process according to an embodiment is described with reference to FIG. 7. FIG. 7 is a flowchart illustrating an example of an anomaly detection process according to an embodiment. The anomaly detection process is executed mainly by the CPU 51 of the controller 50.

When the anomaly detection process is started, the CPU 51 obtains the initial values of the upper limit and the lower limit for anomaly detection, the maximum upper limit, and the minimum lower limit that are stored in a storage such as the RAM 53 or the HDD 54 in association with a recipe used for processing a target wafer (step S30). The recipe used for processing the target wafer may be identified based on a front opening unified pod (FOUP) housing the target wafer together with other wafers in the same lot.

Next, the CPU 51 obtains pressure measurements from log information for the target wafer (step S32). Next, the CPU 51 determines whether a pressure measurement in the obtained pressure measurements is out of the normal range defined by the upper limit and the lower limit (step S34). When it is determined that the pressure measurement is within the normal range defined by the upper limit and the lower limit, the CPU 51 proceeds to step S40. When it is determined that the pressure measurement is out of the normal range defined by the upper limit and the lower limit (this pressure measurement may be referred to as an "anomaly-detected pressure measurement"), the CPU 51 stores the pressure measurement as anomaly information in a storage such as the RAM 53 or the HDD 54 (step S36). The anomaly information may include the anomaly-detected pressure measurement, recipe information, wafer information, and a time when the anomaly-detected pressure measurement is measured.

Next, the CPU 51 determines whether the anomaly-detected pressure measurement is out of a range defined by the maximum upper limit and the minimum lower limit (step S38). When it is determined that the anomaly-detected pressure measurement is within the range defined by the maximum upper limit and the minimum lower limit, the CPU 51 proceeds to step S40. When it is determined that the anomaly-detected pressure measurement is out of the range defined by the maximum upper limit and the minimum lower limit, the CPU 51 performs cleaning of the chamber C (step S42), and ends the anomaly detection process.

At step S40, the CPU 51 determines whether all of the pressure measurements for the target wafer have been processed. When it is determined that all of the pressure measurements have been processed, the CPU 51 ends the anomaly detection process. When it is determined that not all of the pressure measurements have been processed, the CPU 51 returns to step S34 and repeats step S34 and subsequent steps for each of the remaining pressure measurements.

As described above, in the anomaly detection method of the present embodiment, the upper limit and the lower limit are set at appropriate values for each 1-ms interval. This configuration makes it possible to accurately detect a pressure measurement (e.g., peak A in FIG. 5) that is out of the normal range defined by the upper limit and the lower limit, and store the detected pressure measurement as anomaly information.

As exemplified by a peak B in FIG. 5, a peak tends to occur at the beginning of each step due to, for example, a change in the process condition. In the present embodiment, no dead time is set at the beginning of each step. Therefore, the present embodiment also makes it possible to accurately detect even an anomaly represented by a peak occurring at the beginning of each step.

In the present embodiment, when it is determined that an anomaly-detected pressure measurement is out of the range defined by the maximum upper limit and the minimum lower limit, the CPU 51 performs cleaning of the chamber C at step S42. However, the present invention is not limited to this embodiment. For example, when it is determined that an anomaly-detected pressure measurement is out of the range defined by the maximum upper limit and the minimum lower limit, the CPU may perform at least one of the following steps: stopping to update at least one of the upper limit and the lower limit for anomaly detection, cleaning the chamber C, replacing a predetermined part in the chamber C, and calibrating the predetermined part in the chamber C.

<Update Process for Updating Upper Limit and Lower Limit for Anomaly Detection>

Figure 8:
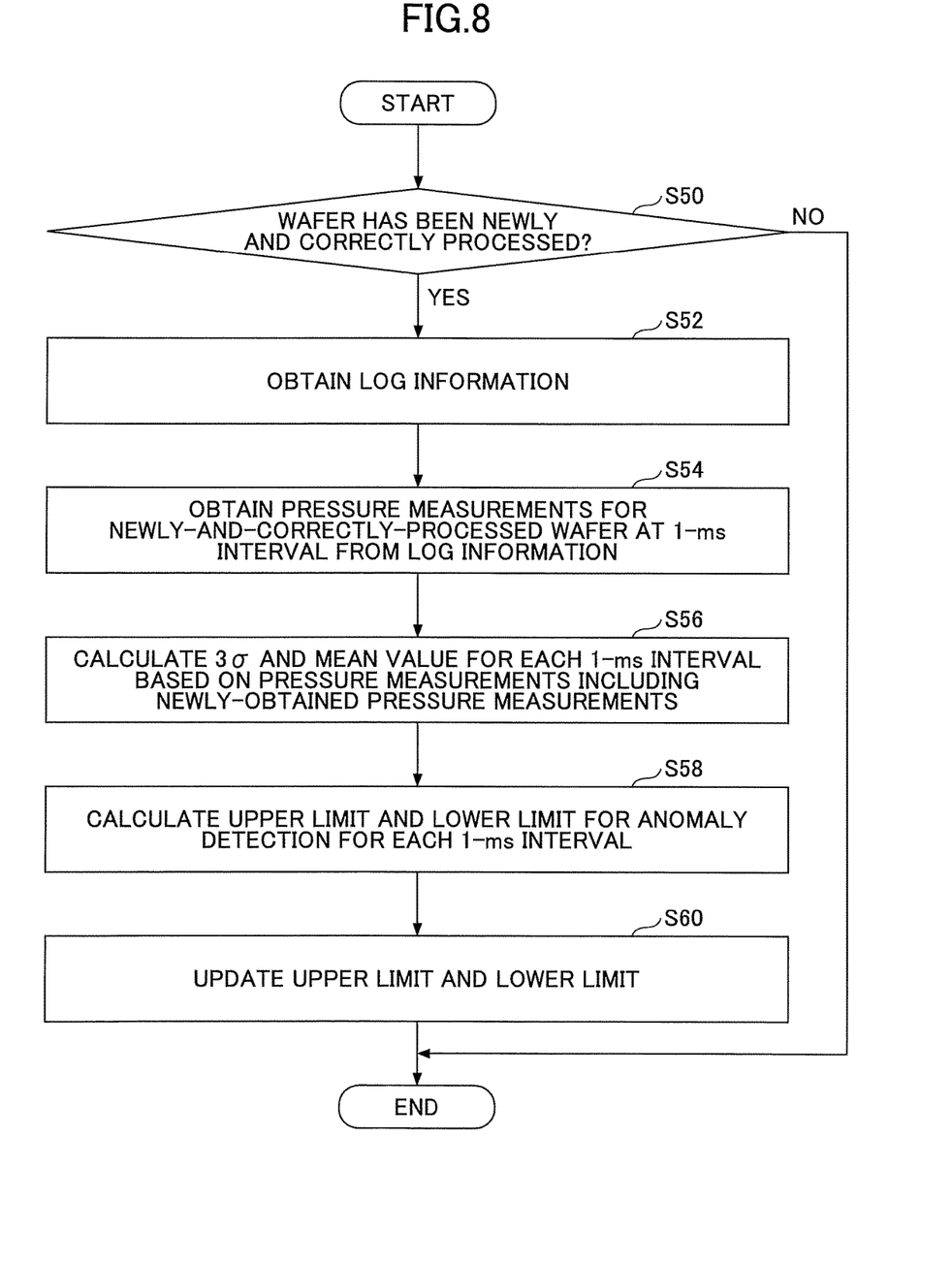
FIG. 8 is a flowchart illustrating an example of an update process for updating an upper limit and a lower limit used for anomaly detection according to an embodiment.

An example of an update process for updating an upper limit and a lower limit used for an anomaly detection method of the present embodiment is described with reference to FIG. 8. FIG. 8 is a flowchart illustrating an example of an update process for updating an upper limit and a lower limit used for anomaly detection according to an embodiment.

When the update process is started, the CPU 51 determines whether one or more wafers have been newly and correctly processed (step S50). When it is determined that no wafer has been newly and correctly processed, the CPU 51 ends the update process. When it is determined that a wafer has been newly and correctly processed, the CPU 51 obtains log information for the newly-and-correctly-processed wafer from the log information DB 61 (step S52). Next, the CPU 51 obtains pressure measurements for the newly-and-correctly-processed wafer at a 1-ms interval from the obtained log information (step S54).

Next, the CPU 51 calculates 3σ and a mean value m for each 1-ms interval based on pressure measurements including the pressure measurements obtained for the newly-and-correctly-processed wafer (step S56). The pressure measurements used at step S56 include pressure measurements previously obtained for correctly-processed wafers and pressure measurements newly obtained for the newly-and-correctly-processed wafer.

Next, based on 3σ and the mean value m calculated at step S56, the CPU 51 calculates the upper limit (=mean value m+3σ) and the lower limit (=mean value m−3σ) for anomaly detection for each 1-ms interval (step S58).

Then, the CPU 51 updates the upper limit and the lower limit stored in the storage in association with the recipe P with the calculated upper and lower limits (step S60), and ends the update process.

As described above, in the present embodiment, when a wafer is newly and correctly processed, 3σ is recalculated based on log information of correctly-processed wafers including the newly-and-correctly processed wafer, and the upper limit and the lower limit for anomaly detection are automatically updated based on the recalculated 3σ. Then, anomaly detection is performed based on the updated upper and lower limits. Thus, the present embodiment makes it possible to update the upper limit and the lower limit to appropriate values according to changes in the conditions of the chamber C due to, for example, reaction products generated as a result of wafer processing, and thereby makes it possible to accurately detect an anomaly in wafer processing. Also, the present embodiment makes it possible to eliminate the need for a user to periodically recalculate the upper limit and the lower limit for anomaly detection.

<Recalculation of Upper Limit and Lower Limit after Cleaning>

An example of a recalculation process for recalculating an upper limit and a lower limit for anomaly detection after a cleaning process is described with reference to FIG. 9. FIG.

9 is a flowchart illustrating an example of a recalculation process for recalculating an upper limit and a lower limit for anomaly detection after a cleaning process.

When the recalculation process is started, the CPU 51 determines whether the cleaning of the chamber C has been completed (step S70). When it is determined that the cleaning of the chamber C has been completed, the CPU 51 obtains log information for "s" wafers correctly processed after the cleaning from the log information DB 61 (step S72). Here, "s" indicates any number greater than or equal to two. Because log information of wafers processed immediately after the cleaning may include unstable information, the CPU 51 may obtain log information of correctly-processed "s" wafers excluding log information of a predetermined number of wafers that are processed immediately after the cleaning.

Next, the CPU 51 obtains pressure measurements for each wafer at a 1-ms interval from the obtained log information (step S74).

Next, the CPU 51 recalculates 3σ and a mean value m for each 1-ms interval based on "n" pressure measurements obtained at the same timing or substantially the same timing (step S76). Next, based on 3σ and the mean value m recalculated at step S76, the CPU 51 recalculates the initial values of the upper limit (=mean value m+3σ) and the lower limit (=mean value m−3σ) for anomaly detection for each 1-ms interval (step S78).

Next, the CPU 51 recalculates the maximum upper limit (=mean value m+6σ) and the minimum lower limit (=mean value m−6σ) for each 1-ms interval (step S80).

Then, the CPU 51 stores the initial values of the upper limit and the lower limit, the maximum upper limit, and the minimum lower limit recalculated at the above steps in the storage in association with the recipe P (step S82), and ends the calculation process.

As described above, according to the present embodiment, the upper limit and the lower limit for anomaly detection are recalculated taking into account the internal environment of the cleaned chamber C. This configuration makes it possible to set the upper limit and the lower limit for anomaly detection at appropriate values according to changes in the internal conditions of the chamber C resulting from the cleaning. Thus, the present embodiment makes it possible to accurately detect an anomaly in wafer processing and eliminate the need for a user to periodically recalculate the upper limit and the lower limit.

Figure 9:
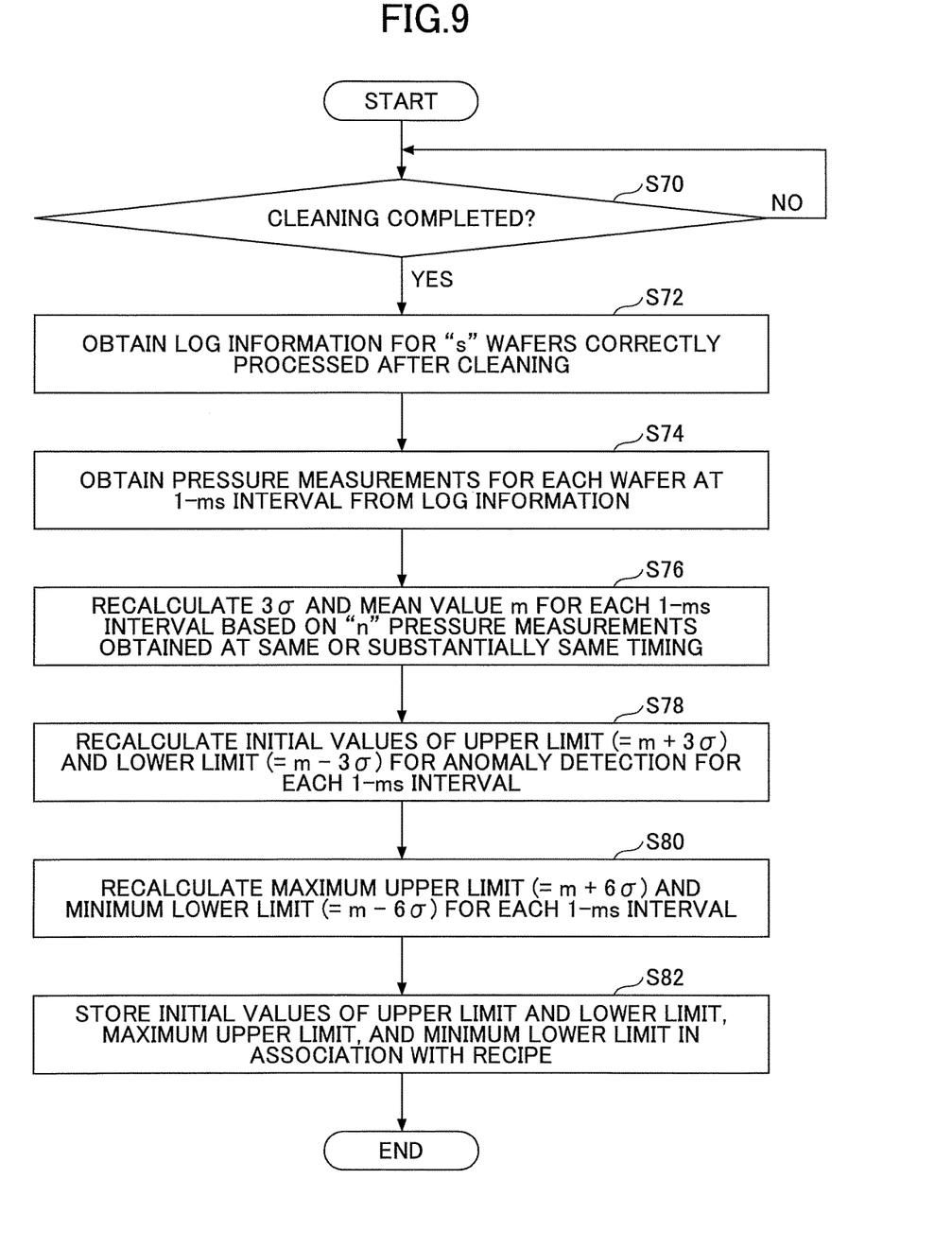
FIG. 9 is a flowchart illustrating an example of a recalculation process for recalculating an upper limit and a lower limit for anomaly detection after a cleaning process.

As an alternative, instead of recalculating the upper limit and the lower limit for anomaly detection after the cleaning as in FIG. 9, the upper limit and the lower limit may be reset to the initial values of the upper limit and the lower limit calculated in the process of FIG. 6.

An anomaly detection method and a semiconductor manufacturing apparatus according to the embodiments are described above. However, the present invention is not limited to the specifically disclosed embodiments, and variations and modifications may be made without departing from the scope of the present invention. Also, the embodiments may be combined as long as they do not conflict with each other.

For example, in the above embodiments, the pressure in the chamber C is used as an example of a process condition to describe the anomaly detection method. However, the process condition to be monitored to detect an anomaly is not limited to pressure. For example, a reflected wave of high-frequency power, a gas flow rate, or a temperature in the chamber C may be used as the process condition.

Also, the semiconductor manufacturing apparatus 10 is not limited to a capacitively-coupled plasma (CCP) etching apparatus. For example, the semiconductor manufacturing apparatus 10 may also be implemented by an inductively-coupled plasma (ICP) processing apparatus, a plasma processing apparatus using a radial line slot antenna, a helicon wave plasma (HWP) apparatus, an electron cyclotron resonance (ECR) plasma apparatus, or a surface-wave plasma processing apparatus.

Although the semiconductor wafer W is used as an example of an object to be etched in the above embodiments, the object to be etched is not limited to the semiconductor wafer W. For example, the object to be etched may also be a board used for a liquid crystal display (LCD) or a flat panel display (FPD), a photomask, a CD substrate, or a printed-circuit board.

An aspect of this disclosure provides an anomaly detection method and a semiconductor manufacturing apparatus that can accurately detect an anomaly in substrate processing.

What is claimed is:

1. A method performed by a semiconductor manufacturing apparatus, the method comprising:
    calculating, by a processor of the semiconductor manufacturing apparatus, 3 standard deviations of process condition measurements obtained at a predetermined interval from log information of processing of substrates that have been correctly processed;
    calculating at least one of an upper limit and a lower limit for anomaly detection based on the calculated 3 standard deviations; and
    detecting an anomaly in the processing of the substrates based on the at least one of the upper limit and the lower limit
    wherein the 3 standard deviations are calculated based on the process condition measurements that are obtained from the log information at an interval of several ms or less.

2. The method as claimed in claim 1, wherein the 3 standard deviations are calculated based on each set of pressure condition measurements obtained at a same timing or substantially a same timing for the substrates among the pressure condition measurements obtained at the interval of several ms or less from the log information.

3. The method as claimed in claim 1, wherein the 3 standard deviations are calculated based on the process condition measurements that are obtained from the log information at an interval of 1 ms or less.

4. The method as claimed in claim 1, further comprising:
    updating the 3 standard deviations based on process condition measurements obtained at the predetermined interval from log information of processing of one or more substrates that have been newly and correctly processed;
    updating the at least one of the upper limit and the lower limit based on the updated 3 standard deviations; and
    detecting the anomaly in the processing of the substrates based on the updated at least one of the upper limit and the lower limit.

5. The method as claimed in claim 4, further comprising:
    calculating 6 standard deviations of the process condition measurements;
    calculating at least one of a maximum upper limit and a minimum lower limit based on the calculated 6 standard deviations; and
    when the updated at least one of the upper limit and the lower limit is greater than or less than the at least one of the maximum upper limit and the minimum lower limit, performing at least one of steps including stopping to update the at least one of the upper limit and the lower limit, cleaning a process chamber of the semiconductor manufacturing apparatus for processing the substrates, replacing a predetermined part in the process chamber, and calibrating the predetermined part in the process chamber.

6. The method as claimed in claim 5, further comprising:
when one of cleaning the process chamber, replacing the predetermined part in the process chamber, and calibrating the predetermined part in the process chamber is performed, recalculating the 3 standard deviations based on process condition measurements obtained from log information of processing of substrates that are newly and correctly processed;
recalculating the at least one of the upper limit and the lower limit based on the recalculated 3 standard deviations; and
detecting the anomaly in the processing of the substrates based on the recalculated at least one of the upper limit and the lower limit.

7. The method as claimed in claim 6, wherein
the 6 standard deviations are calculated when the 3 standard deviations are initially calculated and are recalculated when the 3 standard deviations are recalculated; and
the at least one of the maximum upper limit and the minimum lower limit is calculated and recalculated based on the calculated 6 standard deviations and the recalculated 6 standard deviations.

8. A semiconductor manufacturing apparatus, comprising:
a process chamber for substrate processing;
a storage; and
a controller configured to
calculate 3 standard deviations of process condition measurements obtained at a predetermined interval from log information of processing of substrates that have been correctly processed in the process chamber,
calculate at least one of an upper limit and a lower limit for anomaly detection based on the calculated 3 standard deviations,
store the at least one of the upper limit and the lower limit in the storage, and
detect an anomaly in the processing of the substrates based on the at least one of the upper limit and the lower limit stored in the storage,
wherein the controller is configured to calculate the 3 standard deviations based on the process condition measurements that are obtained from the log information at an interval of several ms or less.

9. A method performed by a semiconductor manufacturing apparatus, the method comprising:
calculating, by a processor of the semiconductor manufacturing apparatus, 3 standard deviations of process condition measurements obtained at a predetermined interval from log information of processing of substrates that have been correctly processed;
calculating at least one of an upper limit and a lower limit for anomaly detection based on the calculated 3 standard deviations;
detecting an anomaly in the processing of the substrates based on the at least one of the upper limit and the lower limit;
updating the 3 standard deviations based on process condition measurements obtained at the predetermined interval from log information of processing of one or more substrates that have been newly and correctly processed;
updating the at least one of the upper limit and the lower limit based on the updated 3 standard deviations; and
detecting the anomaly in the processing of the substrates based on the updated at least one of the upper limit and the lower limit.

* * * * *